United States Patent
Wood

(10) Patent No.: US 7,352,189 B2
(45) Date of Patent: Apr. 1, 2008

(54) TIME ALIGNED BUSSED TRIGGERING USING SYNCHRONIZED TIME-STAMPS AND PROGRAMMABLE DELAYS

(75) Inventor: Duaine C. Wood, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/076,812

(22) Filed: Mar. 9, 2005

(65) Prior Publication Data

US 2006/0202672 A1 Sep. 14, 2006

(51) Int. Cl.
*H04B 3/04* (2006.01)

(52) U.S. Cl. .................. 324/532; 324/76.11; 323/283; 333/139

(58) Field of Classification Search .............. 324/532; 331/153; 323/283; 333/139
See application file for complete search history.

(56) References Cited

U.S. PATENT DOCUMENTS

| | | | | |
|---|---|---|---|---|
| 5,811,655 A | * | 9/1998 | Hashimoto et al. | 73/1.42 |
| 6,486,691 B2 | * | 11/2002 | Tsujii | 324/765 |
| 6,587,055 B1 | * | 7/2003 | Turner et al. | 340/856.3 |
| 6,879,201 B1 | * | 4/2005 | Chan | 327/291 |
| 6,954,079 B2 | * | 10/2005 | Sugimoto et al. | 324/763 |
| 2002/0135343 A1 | * | 9/2002 | Underbrink et al. | 323/283 |
| 2004/0205151 A1 | * | 10/2004 | Sprigg et al. | 709/217 |
| 2005/0146525 A1 | * | 7/2005 | Widera et al. | 345/440 |
| 2005/0170843 A1 | * | 8/2005 | Billhartz et al. | 455/456.1 |
| 2005/0210332 A1 | * | 9/2005 | Ura et al. | 714/26 |
| 2006/0127053 A1 | * | 6/2006 | Lee | 386/96 |

* cited by examiner

Primary Examiner—Andrew H. Hirshfeld
Assistant Examiner—John Zhu

(57) ABSTRACT

Techniques for triggering that provide time-aligned triggering of a set of components using a bussed topology. Triggering according to the present teachings includes a set of components that each include circuitry for measuring a propagation delay on a trigger bus of a test trigger signal from each of a set of sources of the test trigger signal and a programmable delay circuit for delaying a trigger signal in response to a corresponding delay setting derived from the measured propagation delays.

24 Claims, 3 Drawing Sheets

TIME ALIGNED BUSSED TRIGGERING USING SYNCHRONIZED TIME-STAMPS AND PROGRAMMABLE DELAYS

BACKGROUND

It is common in a system of components to coordinate the actions of the components using trigger signals. Examples of components that may be coordinated using trigger signals are numerous and include sensors, actuators, computational devices, application controllers, computer systems, measurement instruments, devices under test, etc.

Trigger signals may be distributed to a set of components using a trigger bus. For example, a trigger source may apply a trigger signal to a trigger bus and the trigger signal propagates to each component connected to the trigger bus. The times that the components on the trigger bus receive the trigger signal may depend on the distances between the components and the trigger source. For example, components farther away from the trigger source receive the trigger signal later than components closer to the trigger source due to propagation delay on the trigger bus. A trigger bus topology may offer the benefit of relatively easy system modifications. For example, a new component may be relatively easy to add to a trigger bus. Unfortunately, the variation in times that the components in a bussed topology receive a trigger signal may prevent precise coordination of the actions performed by the components.

Alternatively, trigger signals may be distributed to a set of components using point-to-point trigger signal line connections between a trigger source and each component. Point-to-point signal line connections from a trigger source to a set of components may be referred to as a star topology. A star topology enables equalization of the propagation delays of the trigger signal by selecting the lengths of the signal lines that carry the trigger signals to the components. Unfortunately, systems that use a star topology may be difficult to expand because additional trigger signal line connections may not be available for new components added to the system.

SUMMARY OF THE INVENTION

Techniques for triggering are disclosed that provide time-aligned triggering of a set of components using a bussed topology. Triggering according to the present teachings includes a set of components coupled to a trigger bus. Each component includes circuitry for measuring a propagation delay on the trigger bus of a test trigger signal from each of a set of sources of the test trigger signal. Each component further includes a programmable delay circuit for delaying a trigger signal in response to a corresponding delay setting derived from the measured propagation delays.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
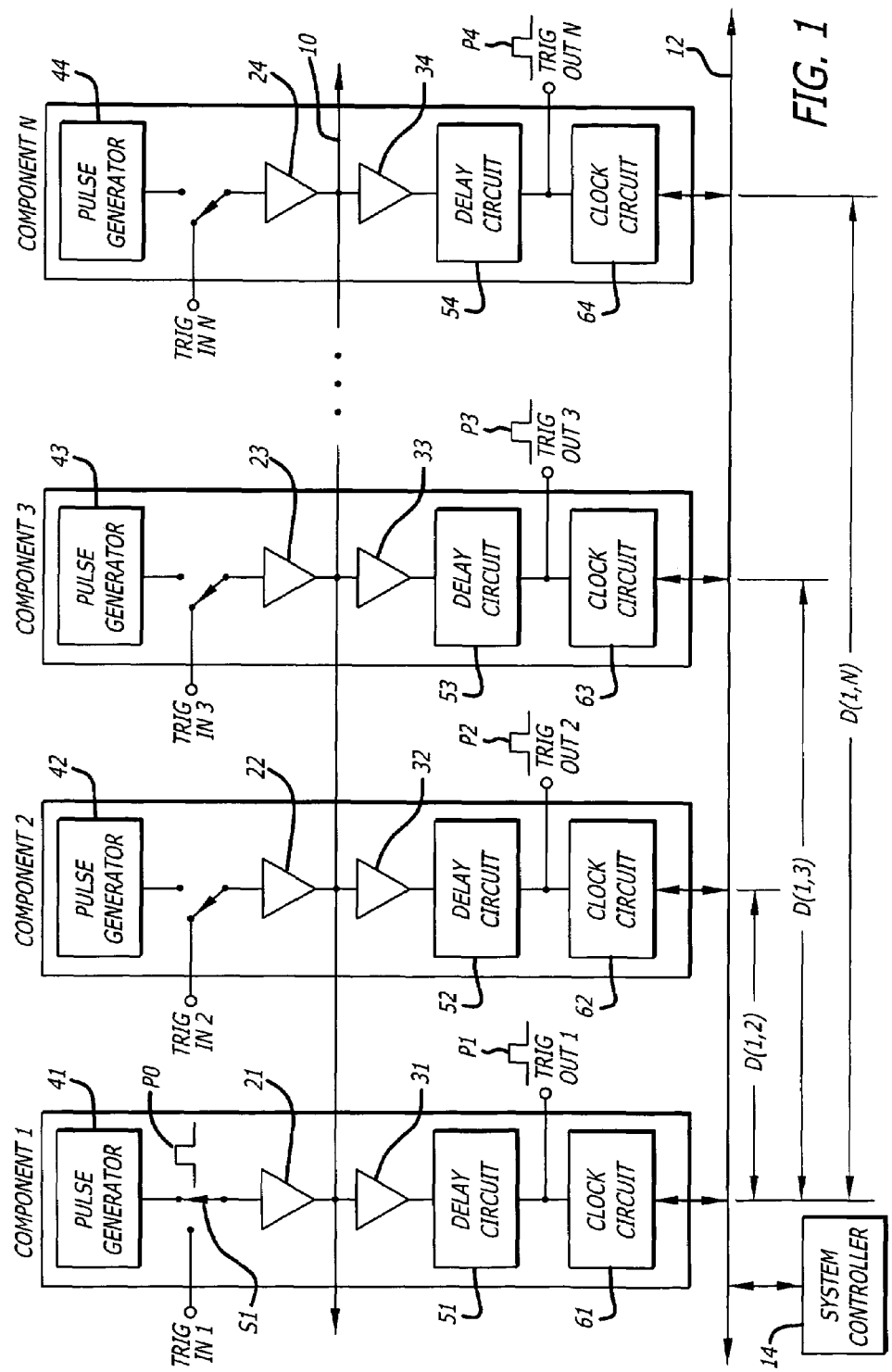
FIG. 1 shows a set of components that are triggered using the present techniques.

FIG. 1 shows a system having a set of components 1-N that are triggered according to the present techniques. The components 1-N each represent any device or module that may be coordinated using trigger signals. Examples for the components 1-N include sensors, actuators, computation devices, application controllers, computer systems, measurement instruments, etc.

The components 1-N are triggered by transferring a trigger signal to the components 1-N via a trigger bus 10. Each component 1-N generates a corresponding time aligned trigger signal by receiving the trigger signal via the trigger bus 10 and delaying the trigger signal. In the example shown, the component 1 is the source of the trigger signal, a trigger pulse P0, and the components 1-N generate a set of time aligned trigger signals, trigger pulses P1-P4, respectively, by delaying the trigger pulse P0.

Each component 1-N delays the trigger signal by an amount of delay that is selected in response to a maximum propagation delay on the trigger bus 10 from a source of the trigger signal to the components 1-N, i.e. in this example a maximum propagation delay of the trigger pulse P0 on the trigger bus 10 from the component 1 to the components 1-N. In one embodiment, a system controller 14 determines the propagation delays from the source of the trigger signal to each of the components 1-N and programs a delay setting into each component in response to the propagation delays. The propagation delays are determined by time-stamping the trigger signal upon receipt in each component 1-N.

The system controller 14 communicates with the components 1-N via a communication network 12. The system controller 14 performs programmatic control of the components 1-N by sending messages to the components 1-N via the communication network 12. For example, the system controller 14 commands the components 1-N to generate trigger pulses and programs delay settings into the components 1-N using messages carried on the communication network 12. In addition, the system controller 14 obtains time-stamp data from the components 1-N in messages carried on the communication network 12.

Each of the components 1-N is capable of simultaneously transmitting and receiving trigger signals via the trigger bus 10. For example, the component 1 includes a bus driver circuit 21 for transmitting a trigger pulse on the trigger bus 10 and a receive buffer circuit 31 for receiving a trigger pulse carried on the trigger bus 10. Similarly, the components 2-N each include a respective bus driver circuit 22-24 and a respective receive buffer circuit 32-34.

Each of the components 1-N is capable of driving the trigger bus 10 from an internal pulse generator under programmatic control. For example, the component 1 includes a pulse generator 41 that generates the trigger pulse P0 and a switch S1 for routing the trigger pulse P0 to the bus driver circuit 21 under programmatic control. Similarly, the components 2-N each include a respective pulse generator 42-44 and a respective switch S2-Sn.

Each of the components 1-N is capable of programmatically delaying a received trigger pulse. The amount of delay may be set in discrete increments over a range of delay equal to or greater than the worst case trigger delay among the components 1-N along the trigger bus 10. For example, the component 1 includes a delay circuit 51 for delaying a trigger pulse received via the receive buffer circuit 31 to provide the time aligned trigger pulse P1. Similarly, the components 2-N each include a respective delay circuit 52-54 for delaying the trigger pulses received via the respective receive buffer circuits 32-34 to provide the respective time aligned trigger pulses P2-P4.

Each of the components 1-N is capable of detecting and recording a time-of-arrival of the leading edge of a received trigger pulse. For example, the component 1 includes a clock circuit 61 for recording a time-of-arrival of a trigger pulse received via the receive buffer circuit 31. In one embodiment, the clock circuit 61 generates a time-stamp on a rising edge of a trigger pulse received via the receive buffer circuit 31. Similarly, the components 2-N each include a respective clock circuit 62-64 for time-stamping the trigger pulses received via the respective receive buffer circuits 32-34.

The clocks 61-64 maintain a common time base by synchronizing their internally held time of day. In one embodiment, the clocks 61-64 synchronize their internal time by exchanging timing messages via the communication network 12 according to a clock synchronization protocol described in the IEEE 1588-2002 Standard for a Precision Clock Synchronization Protocol for Networked Measurement and Control Systems, IEEE, 8 Nov. 2002, ISBN 0-7381-3369-8.

In one embodiment, the system controller 14 determines the delay settings for the delay circuits 51-54 by generating one or more test trigger signals and measuring the time-of-arrival of the test trigger signals at the components 1-N. Initially, the system controller 14 sends commands that cause the components 1-N to reset the delay circuits 51-54 to a minimum delay setting. The system controller 14 then sends a command to one of the components 1-N that causes it to generate a test trigger signal, e.g. the trigger pulse P0, onto the trigger bus 10 using its internal pulse generator. The test trigger signal propagates on the trigger bus 10 and is received by each component 1-N and the leading edge of the test trigger signal is time-stamped by each component 1-N including the component that generated the trigger pulse. The components 1-N upload the obtained time-stamps to the system controller 14 via the communication network 12. The system controller 14 uses the time-stamps to determine the delays associated with the propagation of the test trigger signal among the components 1-N. The system controller 14 may repeatedly gather time-stamp data using several test trigger signals and then average the corresponding time-stamps to determine the delays.

The system controller 14 determines the delay from the component 1 to the component 2, D(1,2), by subtracting the time-stamp obtained by the component 1 on receipt of a test trigger signal from the time-stamp obtained by the component 2 upon receipt of the test trigger signal. The system controller 14 performs similar calculations to determine the delays for the other components 2-N. This yields D(1,x), x=1,2,3, . . . N. The delay from a component to itself is assumed to be zero, i.e. D(1,1)=0. The system controller 14 repeats the above steps a total of N times, with each consecutive component 1-N acting as the transmitter of a test trigger signal.

Figures 2, 3:
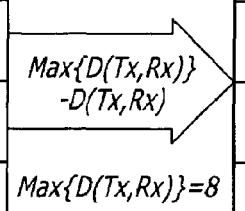
FIG. 2 is a delay matrix that shows the delays in test trigger signal propagation among a set of components.
FIG. 3 illustrates a method for determining a delay settings matrix for an example set of delay values in a delay matrix.

FIG. 2 illustrates the delays in test trigger signal propagation among the components 1-N represented as an N×N delay matrix 100, D(Tx,Rx), of delay values, where Tx is the transmitting component number 1-N and Rx is the receiving component number 1-N. The system controller 14 determines the delay settings for the delay generators 51-54 by subtracting each element in the delay matrix 100 from the maximum value in the delay matrix 100.

FIG. 3 shows a delay settings matrix 110 for an example set of delay values in the delay matrix 100. The delay settings matrix 110 provides the delay settings to be programmed into the delay generators 51-54 for a given trigger source. For example, if the component 1 is the trigger source then the delay settings in column 1 of the delay settings matrix 110 are programmed into the delay generators 51-54. Similarly, if the component 2 is the trigger source then the delay settings in column 2 of the delay settings matrix 110 are programmed into the delay generators 51-54. The system controller 14 determines the delay settings in the delay settings matrix 110 by subtracting element-by-element the delay values in the delay matrix 100 from the maximum value in the delay matrix 100 which in this example is a maximum delay value of 8.

A system may include multiple trigger busses each of which may be referred to as a trigger channel. A system controller may generate test trigger signals and obtain corresponding time-stamps for each trigger channel, i.e. a separate N×N delay matrix for each trigger channel.

Figure 4:
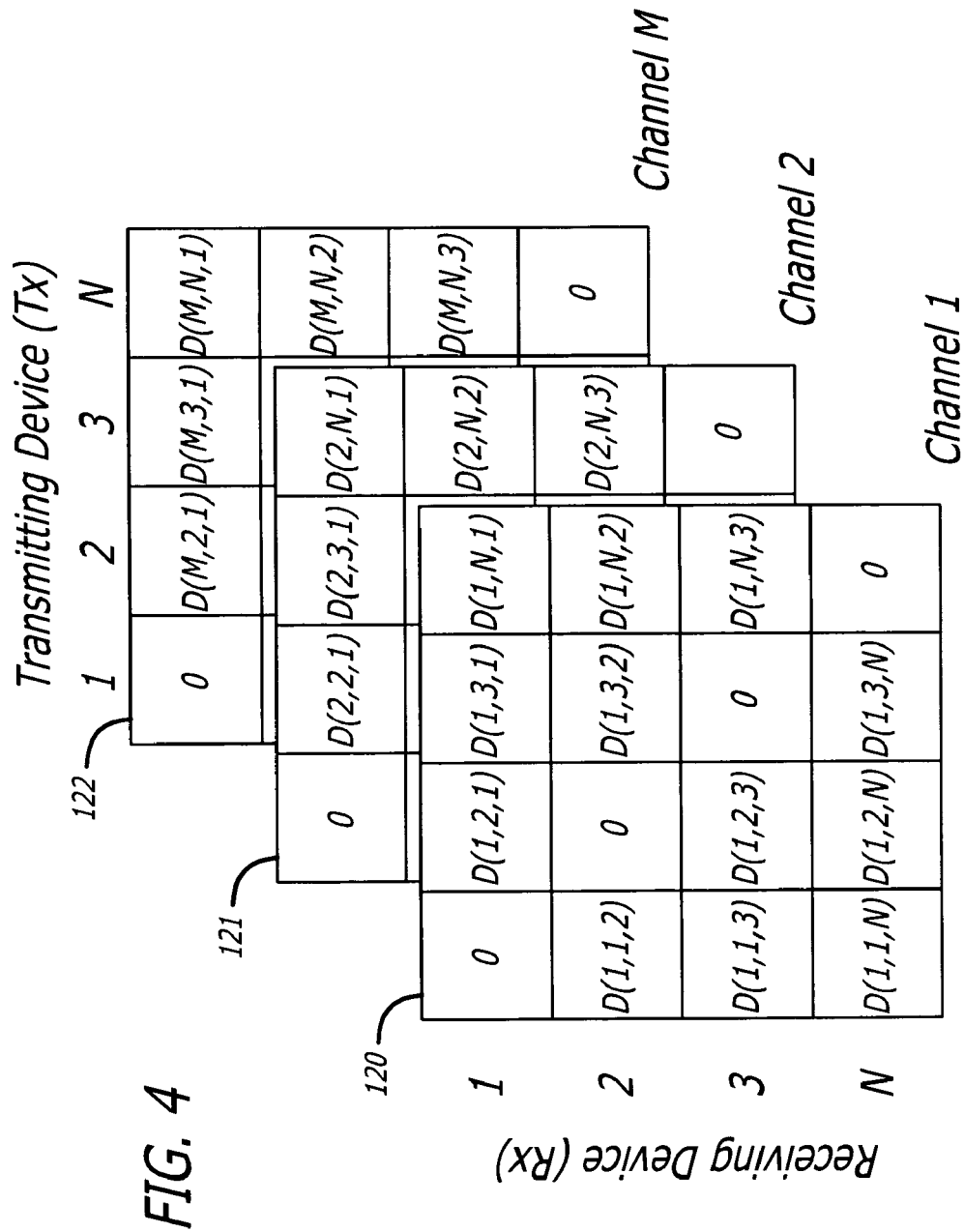
FIG. 4 shows a set of delay matrices for a multi-channel triggering system according to the present techniques.

FIG. 4 illustrates a set of delay matrices 120-122 in a multi-channel triggering system represented as an M×N×N matrix, D(Ch,Tx,Rx), where M=number of trigger channels, N=number of components, Ch is the channel number, Tx is the transmitting component number 1-N and Rx is the receiving component number 1-N. All delays may be assumed to be asymmetric, i.e. D(a,b) is not assumed to be equal to D(b,a).

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A system that provides a time-aligned triggering among a set of components coupled to a trigger bus, comprising:
   a clock circuit and a pulse generator and a delay circuit in each component;
   a system controller that sends a command to one of the components that causes the corresponding pulse generator to generate a test trigger signal and that uses the clock circuits to measure a set of propagation delays on the trigger bus of the test trigger signal carried among the components and that determines a set of delay settings for the delay circuits in response to the propagation delays and that programs the delay settings into the delay circuits such that each delay circuit generates a corresponding time-aligned trigger signal by delaying a trigger signal carried on the trigger bus in response to the corresponding delay setting
   wherein the clock circuits in each of the components are synchronized with one another independent of the delay circuits in the components.

2. The system of claim 1, wherein the clock circuits measure the propagation delays upon respective receipt of the test trigger signal via the trigger bus.

3. The system of claim 1, wherein the system controller uses the pulse generators and the clock circuits to measure a set of propagation delays on each of a set of additional trigger buses to the components.

4. The system of claim 1, wherein the clock circuits each hold a time of day.

5. The system of claim 4, further comprising a local area network such that the clock circuits synchronize the time of day using the local area network.

6. The system of claim 1, wherein the system controller determines the delay settings by determining a maximum propagation delay on the trigger bus from a source of the trigger signal to each component.

7. The system of claim 1, wherein the system controller determines the delay settings by averaging a set of measurements of the propagation delay for each component.

8. A system that provides a time-aligned triggering among a set of components coupled to a trigger bus, comprising:
    a clock circuit and a pulse generator and a delay circuit in each component;
    a system controller that sends a command to one of the components that causes the corresponding pulse generator to generate a test trigger signal and that uses the clock circuits to measure a set of propagation delays on the trigger bus of the test trigger signal carried among the components and that determines a set of delay settings for the delay circuits in response to the propagation delays and that programs the delay settings into the delay circuits such that each delay circuit generates a corresponding time-aligned trigger signal by delaying a trigger signal carried on the trigger bus in response to the corresponding delay setting;
    wherein each clock circuit measures the corresponding propagation delay by generating a time-stamp upon receipt of the test trigger signal.

9. The system of claim 8, wherein the system controller obtains the time-stamps from the components and determines the delay settings in response to the time-stamps.

10. A method for time-aligned triggering among a set of components coupled to a trigger bus, comprising:
    providing a clock circuit and a pulse generator and a delay circuit in each component, wherein the clock circuits in each of the components are synchronized with one another independent of the delay circuits in the components;
    measuring a set of propagation delays on the trigger bus of a test trigger signal carried among the components by sending a command to one of the components that causes the corresponding pulse generator to generate the test trigger signal and by using the clock circuits to determine the propagation delays; and
    determining a set of delay settings for the delay circuits in response to the propagation delays and programming the delay settings into the delay circuits such that each delay circuit generates a corresponding time-aligned trigger signal by delaying a trigger signal carried on the trigger bus in response to the corresponding delay setting.

11. The method of claim 10, wherein measuring includes measuring the propagation delays upon respective receipt of the test trigger signal via the trigger bus.

12. The method of claim 10, further comprising measuring a set of propagation delays on each of a set of additional trigger buses to the components.

13. The method of claim 10, further comprising synchronizing a time of day in the local clocks.

14. The method of claim 10, wherein determining comprises determining a maximum propagation delay on the trigger bus from a source of the trigger signal to each component.

15. The method of claim 10, wherein determining comprises averaging a set of measurements of the propagation delay for each component.

16. A method for time-aligned triggering among a set of components coupled to a trigger bus, comprising:
    providing a clock circuit and a pulse generator and a delay circuit in each component,
    measuring a set of propagation delays on the trigger bus of a test trigger signal carried among the components by sending a command to one of the components that causes the corresponding pulse generator to generate the test trigger signal and by using the clock circuits to determine the propagation delays; and
    determining a set of delay settings for the delay circuits in response to the propagation delays and programming the delay settings into the delay circuits such that each delay circuit generates a corresponding time-aligned trigger signal by delaying a trigger signal carried on the trigger bus in response to the corresponding delay setting;
    wherein measuring includes generating a time-stamp in each clock circuit upon receipt of the test trigger signal.

17. The method of claim 16, wherein determining comprises obtaining the time-stamps from the components and determining the delay settings in response to the time-stamps.

18. A component having a clock circuit and a pulse generator and a delay circuit such that the pulse generator and the clock circuit enable a measurement of a set of propagation delays on a trigger bus of a test trigger signal carried among the component and a set of other components on the trigger bus in response to a command from a system controller and a determination of a delay setting for the delay circuit in response to the propagation delays such that the delay circuit generates a time-aligned trigger signal by delaying a trigger signal carried on the trigger bus in response to the delay setting;
    wherein each of the other components has a clock circuit and a pulse generator and a delay circuit, and wherein the clock circuits in each of the other components are synchronized with one another and with the clock circuit of the component independent of the delay circuits in any of the components.

19. The component of claim 18, wherein the pulse generator generates the test trigger signal on the trigger bus in response to the command.

20. The component of claim 18, wherein the clock circuit generates a time-stamp upon receipt of the test trigger signal.

21. The component of claim 20, wherein the delay settings are derived from the time-stamp.

22. The component of claim 18, wherein the clock circuit holds a time of day.

23. The component of claim 22, wherein the clock circuit synchronizes the time of day using a local area network.

24. The component of claim 18, wherein the delay setting is a maximum propagation delay on the trigger bus from a source of the trigger signal.

* * * * *